United States Patent [19]

Fukushima

[11] Patent Number: 4,907,062
[45] Date of Patent: Mar. 6, 1990

[54] SEMICONDUCTOR WAFER-SCALE INTEGRATED DEVICE COMPOSED OF INTERCONNECTED MULTIPLE CHIPS EACH HAVING AN INTEGRATION CIRCUIT CHIP FORMED THEREON

[75] Inventor: Toshitaka Fukushima, Yokohama, Japan

[73] Assignee: Fujitsu Limited, Kawasaki, Japan

[21] Appl. No.: 258,112

[22] Filed: Oct. 14, 1988

Related U.S. Application Data

[63] Continuation of Ser. No. 914,237, Oct. 2, 1986, abandoned.

[30] Foreign Application Priority Data

Oct. 5, 1985 [JP] Japan ................... 60-222593

[51] Int. Cl.⁴ .................. H01L 27/02; H01L 27/04; H01L 27/10
[52] U.S. Cl. ........................ 375/75; 357/72; 357/59; 357/68
[58] Field of Search ............ 357/59, 75, 72, 81, 357/80, 4, 2, 68

[56] References Cited

U.S. PATENT DOCUMENTS

| | | | |
|---|---|---|---|
| 3,588,632 | 6/1971 | Nakata | 357/81 |
| 3,607,466 | 9/1971 | Miyazaki | 357/59 |
| 3,624,467 | 11/1971 | Bean et al. | 357/59 |
| 3,666,548 | 5/1972 | Brack et al. | 357/59 |
| 3,871,007 | 3/1975 | Wakamiya et al. | 357/59 |
| 3,894,893 | 7/1975 | Kabaya et al. | 357/59 |
| 4,057,824 | 11/1977 | Woods | 357/75 |
| 4,074,342 | 2/1978 | Honn et al. | 357/75 |
| 4,466,181 | 8/1984 | Takishima | 357/75 |

FOREIGN PATENT DOCUMENTS 0110285  6/1984  European Pat. Off. .
0149317  7/1985  European Pat. Off. .
0154431  9/1985  European Pat. Off. .
2704373  8/1977  Fed. Rep. of Germany .
2572849  9/1986  France .

OTHER PUBLICATIONS

Patent Abstracts of Japan, vol. 8, No. 235, Oct. 27, 1984 & JP-A-59 117 250.

Primary Examiner—Rolf Hille
Assistant Examiner—S. V. Clark
Attorney, Agent, or Firm—Staas & Halsey

[57] ABSTRACT

A device equivalent to a wafer-scale integrated device is achieved by employing multiple IC chips installed on a silicon wafer. For fabricating the device, conventional IC chips of necessary different types are prepared, having their aluminum-wired surfaces coated with a silicon nitride film. These IC chips are placed on a substrate made of silicon keeping the wired faces face up. The wafer may be provided with depressions in which the chips are placed for precise positioning. Upon these chips and the wafer, a silicon layer is grown by a PVD method. The grown silicon layer fills gaps between the IC chips and binds the chips to each other and to the wafer, forming a single piece of wafer. Excessively grown silicon which is taller than the chips is removed by mechano-chemical polishing until the silicon nitride surfaces are exposed. During this polishing process, the silicon nitride film protects the wired surfaces from mechanical and chemical damage. The silicon nitride film is chemically removed until the aluminum wirings are exposed. An insulating layer and aluminum patterning are formed upon the exposed IC chips and filled gaps to form multi-layer wirings for interconnecting the chips and forming input/output connections. This method allows low cost wafer-scale integration higher density wirings and good heat-removal.

14 Claims, 3 Drawing Sheets

STEP b       STEP b-1

STEP c

STEP d

STEP e AND f

STEP g

STEP c'

STEP d'

SEMICONDUCTOR WAFER-SCALE INTEGRATED DEVICE COMPOSED OF INTERCONNECTED MULTIPLE CHIPS EACH HAVING AN INTEGRATION CIRCUIT CHIP FORMED THEREON

This is a continuation of co-pending application Ser. No. 914,237 filed on Oct. 2, 1986 now abandoned.

BACKGROUND OF THE INVENTION

1. Field of the Invention

The present invention relates to a wafer-scale integration device including interconnected multiple chips of semiconductor integrated circuits and a fabrication method therefor.

2. Description of the Related Art

In order to meet increasing demand for larger scale integration of semiconductor devices for achieving more functions, higher speeds and smaller gross size, there have been proposed many kinds of methods for integration.

One of the representative methods among them is a multi-chip module. IC (Integrated Circuit) chips are usually encapsulated in a so-called chip carrier, a package, which generally has printed leads on the sides of the carrier. A plurality of the chip-carriers having IC chips therein is mounted on a small ceramic mother board, a substrate, to form a module by conventional hybrid IC technology. A plurality of these modules is further mounted on a big main ceramic board. These multi-chip modules are now used in practical applications. However, with this method, there are problems of cooling the IC chips and wiring the IC chips on the mother board.

The heat dissipated in the IC chips is removed by conduction through the ceramic substrate in the chip-carrier and the ceramic substrate of the mother board, and by forced air flow or liquid flow. Some of the heat is also removed by the main ceramic board. The heat to be removed is now becoming as much as 10 W/cm$^2$ in a modern system. Therefore, the heat resistance of these ceramic boards can not be ignored. On the other hand, because of the requirement for the high-density wiring, the multi-layer ceramic board is generally employed. The wirings in the multi-layer board are made with refractory metals powders, such as molybdenum or tungsten, which, however, have higher electrical resistance than that of the generally used wirings. The high resistance of the wirings, of course, deteriorates the performance of the module circuit. In addition to these problems, the accuracy of placing the chip carriers can not be satisfactorily achieved because the structure of the chip carrier is not suitable for precise positioning. Thus, the spacing of the layer-wirings can not be made small enough to achieve required high density integration.

On the other hand, as another representative method, monolithic semiconductor fabrication technology also has been employed to attempt to satisfy the above-described requirement for the higher scale integration. Accordingly, the size of the monolithic IC chip is now becoming as big as 5 or 6 inches in diameter, a wafer size, and more than several hundreds of thousands of gates are integrated thereon. This is so-called wafer-scale integration. The scale of this integration is several tens through several hundreds times that of prior art LSICs (Large Scale IC). However, for this scale of integration, there are both technical and economical limits for the following reasons.

The yield (that is, the probability of existence of non-defective chips) of larger-scale IC decreases generally in proportion to the nth power of the yield of lower-scale ICs, where n is the ratio of the scale of the larger-scale IC to the scale of the lower-scale IC. Therefore, when the integration scale of a chip becomes larger, the production yield drastically decreases, causing fatal damages to production cost.

In addition to this yield problem, the cost of masks for the relevant photo-lithography becomes extremely expensive, particularly when the production is a relatively small quantity. According to these facts, the wafer-scale integration is almost impossible for industrial application. Therefore, it has been requested to achieve a well-designed very large-scale integration of ICs which solves the above-described technical problems as well as the cost problems at the same time.

SUMMARY OF THE INVENTION

It is a general object of the present invention to provide a high-performance multi-chip integrated circuit equivalent to a wafer-scale integrated circuit but having lower cost.

According to the present invention, a plurality of IC chips having layer-wired surfaces covered with silicon nitride film for chemical and physical protection are prepared. (The term "layer-wiring" or "layer-wired" shall be used hereinafter to mean an electrically conductive layer patterned on an electrically insulating layer or on an active element of an IC chip). A plurality of these IC chips is placed on a substrate which is generally made of the same material as that of the IC chips.

The gaps between the IC chips are filled with a binder material, generally the same material as that of the IC chips, by a crystal growth method, so that the IC chips are bound to each other and to the substrate wafer by the binder material. The binder material is grown excessively upon and taller than the IC chips and is removed by polishing to expose the silicon nitride film.

Next, the silicon nitride film is chemically removed until the layer-wirings of the IC chips are exposed. An electrically insulating layer is coated upon the exposed wired-surface of IC chips as well as the surface of the binder material between the chips, excluding portions where terminal pads of the IC chips are located. Thereafter, aluminum interconnection layer-wirings are formed over the insulating layer to operatively connect the uncoated terminal pads of the IC chips and to provide input/output terminal pads for connection to an external circuit.

The above-mentioned features and advantages of the present invention, together with other objects and advantages, which will become apparent, will be more fully described hereinafter.

BRIEF DESCRIPTION OF THE DRAWINGS

FIG. 7 is a illustrates the cross sectional structure of a finished wafer-scale integrated device according to the present invention;

DESCRIPTION OF PREFERRED EMBODIMENTS

Embodiments of the processes for fabricating a wafer-scale integrated device composed of multiple IC chips according to the present invention are hereinafter described referring to FIGS. 1 through 8.

Figure 1:
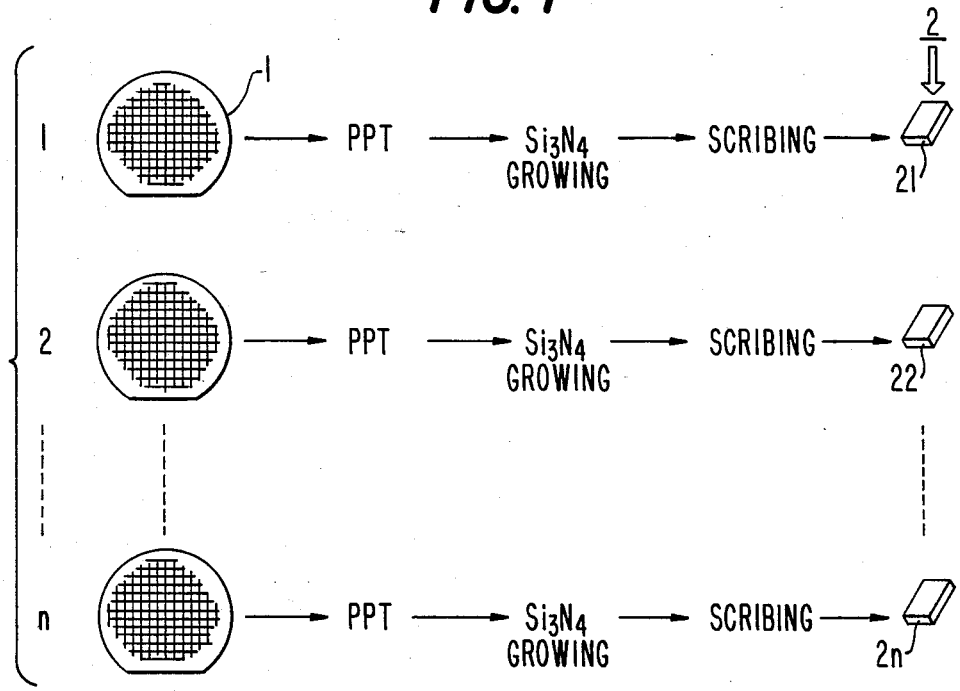
FIG. 1 through FIG. 7 schematically illustrate the respective steps for successively fabricating a wafer-scale integrated device composed of multiple IC chips according to the present invention.
Figure 2:
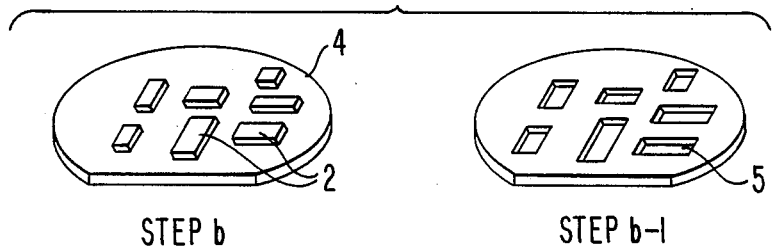

For preparing the IC chips, as shown in FIG. 1, conventional IC wafers 1, 2 . . . n (each numeral indicates a different type of IC) having electrically conductive layer-wirings thereon are tested with probes (referred to as PPT (Primary Probe Test)). At the PPT, defective IC units are marked to be a rejected by conventional method. Aluminum is generally used for the electrically conductive material for layer-wiring on the IC. Upon the surface having the layer-wirings of the wafer, a possivation film of silicon nitride ($Si_3N_4$) a is formed by a conventional method, such as plasma CVD (Chemical Vapor Deposition), etc. During this process, the temperature of the wafer is kept below 500° C. so that the aluminum wiring may not melt nor become an alloy. The thickness of the silicon nitride film is approximately 2000 angstrom. The purpose of providing this silicon nitride film is protection of the aluminum layer-wiring from damage during a succeeding mechanical and chemical polishing process, which shall be described later on in some detail. The wafer coated with the silicon nitride film is scribed into a plurality of individual IC chips by a conventional method. A set of IC chips, a combination of IC chips i.e., of either the same or different IC types, 21, 22 . . . 2n, necessary for constituting the required circuit in the wafer-scale integration, is prepared.

In this embodiment, a silicon wafer made of the same material as that of the IC chips is employed for the substrate wafer 4.

The prepared IC chips are placed on a surface of the substrate wafer 4, as shown in FIG. 2a, keeping each silicon nitride surface face up. The locations of the IC chips are chosen so that interconnections (which shall be described later) between the IC chips are the shortest and the frequency of crossing the interconnection wirings is the fewest.

Organic adhesives may be used for placing the IC chips. However, a more preferable method is to provide the substrate wafer 4 with depressions 5 formed thereon as shown in FIG. 2b. Each of the IC chips is placed in the a corresponding depression. The depressions 5 are made by etching using a photo-lithography method, so that each IC chip can precisely and tightly sit in each depression. The depth of the depressions is chosen so that the top surfaces of the IC chips are at least even or several microns higher than the surface of the substrate wafer 4 and it also dependent upon the thickness of the grown silicon layer. If if the thickness of the IC chips is not uniform, the depth of each depression is chosen so that each wired surface is in a single plane, that is at a uniform height. Etching to a different depth is carried out by performing additional etching on selected depression.

Figure 3:
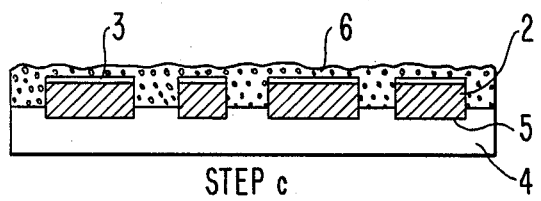

Next, the substrate wafer 4 together with the IC chips in the depressions 5 are processed for growing a silicon layer 6 thereover, as shown in FIG. 3. During this silicon growing process, the temperature of the IC chips is kept low enough to avoid an undesirable effect on the aluminum wiring of the IC chips. Therefore, for growing the silicon layer 6, a CVD method which requires a temperature of more than 600° C. for growing polycrystalline silicon can not be employed. Consequently, a method which does not require such a high temperature, such as a low temperature CVD or sputtering by conventional PVD (Physical Vapor Deposition) is chosen. In the PVD method, a silicon target, such as a cathode, is bombarded by argon ions causing sputtering of silicon. Thus, by PVD, polycrystalline silicon or amorphous silicon is grown to form a layer several microns to several hundred microns thick according to the height of the IC chips. The gaps between the IC chips are filled by this grown silicon, which binds with both the substrate wafer 4 and the scribed sides of the IC chips together to form a solid piece, because both the substrate and the IC chips are made of the same material as that of the chips, i.e., silicon. In other words, the substrate wafer and IC chips form a single piece of solid wafer. Some silicon may be grown excessively upon and taller than the silicon nitride layer 3.

Figure 4:
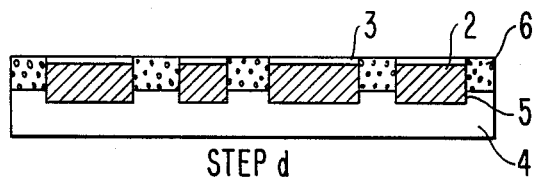

Next, the silicon grown excessively upon and taller than the silicon nitride film 3 is removed by polishing until the silicon nitride film 3 is fully exposed, as shown in FIG. 4. This polishing process is carried out by a mechano-chemical method, which uses alumina powder as an abrasive material and a chemical etchant. While the excessive silicon is polished, the silicon nitride film protects the IC chips from mechanical and chemical damage, because the silicon nitride is mechanically harder than the polishing powder (the alumina powder and is chemically non-reactive with the etchant.

Next, the silicon nitride film 3 is removed by a conventional chemical etching method (not shown in the figure), because the reason for the silicon nitride layer, i.e., protection, is already finished. Even after the removal of the nitride film, the surface is essentially flat, because the thickness of the removed film is as thin as 2000 angstrom. Thus, in FIGS. 5 through 8, the area in which the silicon nitride film was present is not shown. The alumina layer-wiring is shown by 3'.

Figure 5:
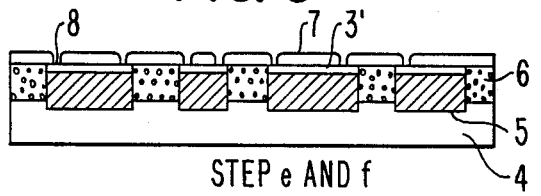
Figure 6:
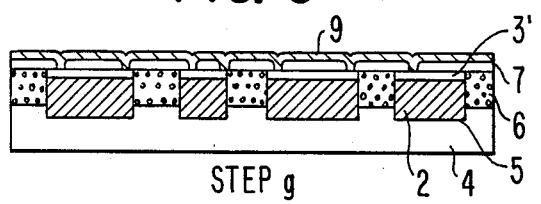

Next, an electrically insulating material is coated to form a layer 7 upon the polished surface. The insulating layer 7 is a conventional insulation film which separates wiring-layers and a conventional wafer processing, such as silicon dioxide ($SiO_2$), silicon nitride ($Si_3N_4$), phospho-silicate glass (PSG) or polyimide is employed. Next, the insulating layer 7 on the particular portions where the terminal pads 8 of the IC chips are located is removed by conventional photo-lithography technology, as shown in FIG. 5. Thus, the terminal pads 8 are exposed.

Next, an electrically conductive layer 9 is deposited upon the insulation layer 7 as well as the exposed terminal pads 8 by a conventional method. The electrically conductive layer 9 is generally aluminum. The deposited aluminum layer 9 is patterned by conventional photo-lithography technology to form an interconnecting wiring. Thus, interconnections between each of the terminal pads 8 of the IC chips 2, as well as new input-/output terminal pads 10 on the insulating layer 7 as terminals for electrical connections of the wafer-scale IC with an external circuit, are fabricated at the same time.

Figure 7:
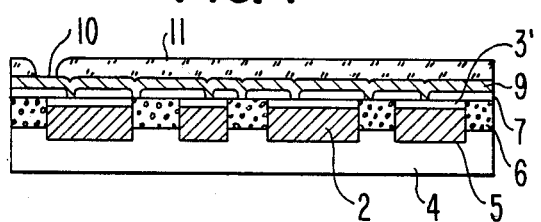

A protection layer 11, made of PSG for example, may be formed upon the wired surface, excluding the input- /output terminal pads 10, by a conventional method, as shown in FIG. 7.

In this description of the embodiment, the aluminum wiring 9 is a single layer, however, it is apparent that two layers or (multi layers are) applicable in a conventional IC process for crossing the wirings. The multi-layer wirings according to the present invention can be produced much less expensively than those of conventional multi-chip modules, because expensive multi-layer ceramic is not used. The multi-layer wiring according to the present invention also can be electrically less resistive than that of the prior art multi-layer in ceramic because an electrically good conductive material, such as aluminum, is used for the wiring.

The locations of the IC chips are determined by the depression made by lithography, thus the positioning of the IC chips is so accurate that the distances between the aluminum wirings can be designed much finer. That is, the integration density is much higher than that of a conventional multi-chip module method using ICs encapsulated in chip carriers.

Figure 8:
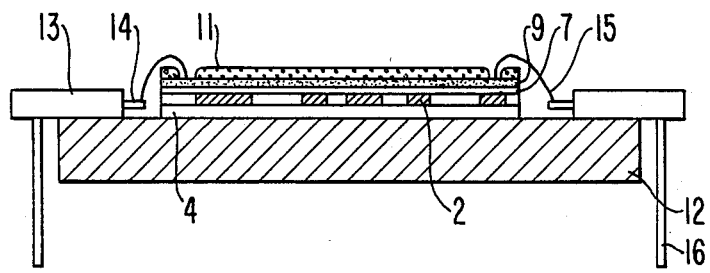
FIG. 8 is a finished wafer-scale integrated device on a base plate.

A wafer made of a single piece which is equivalent to so-called wafer-scale integration is achieved. However, this wafer is mechanically too fragile to be a practical device. The wafer, therefore, is reinforced by being mounted on a base plate 12 made of metal or ceramic, as shown in FIG. 8. This mounting is carried out by brazing or other conventional methods depending on the design requirement. Generally, a very heat-conductive metal is used for the base plate, but a heat conductive ceramic such as beryllia (BeO) or silicon carbide (SiC), etc., can be also used. Any preferable connecting means, such as a bonding wire 15, conventional connector terminal 14 housed in a connector 13, and external leads 16, can be provided on the base plate 12, for the convenience of a latter assembling process of the device. Additionally, the wafer can be hermetically encapsulated by installing a cap (not shown in the figure) over the base plate for mechanical and chemical protection and for heat conduction.

Figure 9:
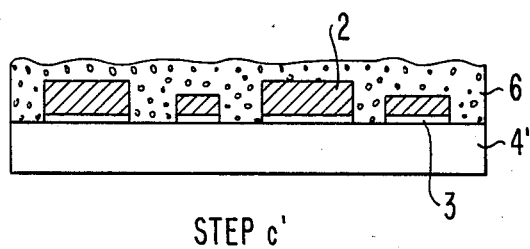
FIGS. 9 and 10 are embodiments of two alternatives to the steps shown in FIGS. 3 and 4, respectively for fabricating the wafer-scale according to the present invention.
Figure 10:
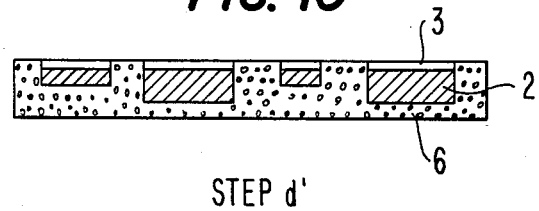

An alternative method for assembling the IC chips as a single big wafer is schematically illustrated in FIGS. 9 and 10. Upon a flat surface of a big substrate wafer 4', IC chips 2 having silicon nitride sufaces are placed keeping each silicon nitride surface 9 in contact with the surface of the wafer 4' as shown by step C' in FIG. 9 in place of the former step C. Silicon is grown in the gaps between the chips 2 and upon the chips 2, by the same method as described above. The thickness of the silicon layer is chosen large enough to hold the chips, for example, at least several hundred microns.

Next, the excessively grown silicon layer upon the chips is removed if necessary by mechano-chemical polishing, the same method as described above.

Next, the substrate wafer 4' is removed by mechano-chemical polishing, until the silicon nitride surface of the IC chips is exposed, as shown by step d' in FIG. 10, in place of step d. During this process, the silicon nitride film protects the chips from mechanical and chemical damage. Even after the removal of the substrate wafer 4', the IC chips are firmly bound to each other to form a single piece of wafer, equivalent to real wafer-scale integration.

Next, successively, the silicon nitride surface films 3 are removed, an electrically insulating layer is formed over the IC chips, a polycrystalline silicon layer is formed thereon, aluminum layer-wirings are fabricated on the polycrystalline silicon layer, and the substrate wafer 4' is mounted on a base plate. The relevant fabrication methods corresponding to the respective processes are the same as those described above. The advantage of this method over the first method shown in FIGS. 3 and 4 is it has flatter layer-wired IC surfaces, particularly when the thickness of the IC chips to be installed on the substrate wafer 4' is not uniform. In FIGS. 9 and 10, the IC chips are placed on the surface of the substrate wafer 4', depressions having uniform depth can be previously provided on the surface of the substrate wafer 4', by photo-lithography technology, the same way as described before for positioning the IC chips precisely.

The advantages of the present invention are summarized as follows:

The prepared IC chips are all tested and the defects are all rejected beforehand, therefore the yield of the wafer-scale integrated device, including the combination of these pretested IC chips, high.

The freedom in designing a system is very large, because IC chips of different types are easily chosen out of ready-made types to form a required circuit.

The wirings between the IC chips are fabricated upon the flat isolation layer by conventional IC technology, so the easiness of the multi-layer wiring results in achieving not only more flexibility in designing but a high density wiring pattern, having a pitch as small as several tens of micrometers, and lower fabrication cost thereof.

Conventional and readily existing production facilities of wafer-processings are used for embodying the present invention, thus no additional facilities are required.

A multi-layer ceramic substrate is not used, thus contributing to reduction of cost of materials as well as the reduction of the heat resistance for cooling the IC chips, because a silicon wafer has lower heat resistance than a ceramic wafer.

The many features and advantages of the invention are apparent from the detailed specification and thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What we claim is:

1. A semiconductor wafer-scale integrated device including interconnected multiple semiconductor chips on each of which an integrated circuit (IC) is fabricated, comprising:
   a plurality of integrated circuit chips, each of said integrated circuit chips having a first electrically conductive layer wiring formed on each chip, and first terminal pads formed thereon, a passivation film being formed on said first conductive layer-wiring;
   a substrate composed substantially of silicon having said integrated circuit chips installed on an upper surface, gaps being formed between said integrated circuit chips;
   a binder material, formed in said gaps between said plurality of integrated circuit chips, for binding said plurality of integrated circuit chips to said substrate and to each other, said binder material being substantially coplanar with said integrated circuit chips and formed of a material selected from a group consisting of monocrystalline silicon, grown polycrystalline silicon, and grown amorphous silicon;
a first electrically insulating layer, formed on said first electrically conductive layer-wiring and said filled gaps, except where said first terminal pads are located;
a second electrically conductive layer-wiring, formed on said first electrically insulating layer, for operatively interconnecting one of said first terminal pads to another corresponding one of said first terminal pads; and
a second terminal pad of said second electrically conductive layer-wiring being formed on said first electrically insulating layer and operatively connected to an external circuit.

2. A wafer-scale integrated device according to claim 1, wherein said substrate comprises essentially the same material as the material of said integrated circuit chips.

3. A wafer-scale integrated device according to claim 1, wherein said substrate has depressions formed therein, and wherein said integrated chips are placed in the depressions in said substrate such that said integrated circuit chips have their wired surface facing in an upward direction.

4. A wafer-scale integrated device according to claim 1, wherein said binder material comprises essentially the same material as the material of said integrated circuit chips.

5. A wafer-scale integrated device according to claim 4, wherein said binder material comprises grown polycrystalline silicon.

6. A wafer-scale integrated device according to claim 4, wherein said binder material comprises grown amorphous silicon.

7. A wafer-scale integrated device according to claim 1, further comprising:
at least one additional second electrically conductive layer-wiring formed on said first electrically insulating layer for operatively interconnecting one of said first terminal pads to another corresponding one of said first terminal pads and for providing said second terminal pad for operatively connecting the external circuit; and
at least one additional second electrically insulating layer formed on said first electrically insulating layer and said second electrically conductive layer-wiring excluding a portion where said second terminal pad is located.

8. A wafer-scale integrated device according to claim 1, wherein said wafer-scale integrated device is installed on a surface of a base plate, a bottom surface of said wafer-scale integrated device fully contacting said surface of said base plate, whereby said wafer-scale integrated device is mechanically held and dissipated heat in said substrate is removed by conduction through said base plate.

9. A semiconductor wafer-scale integrated device including interconnected multiple semiconductor chips on each of which an integrated circuit is fabricated, comprising:
a plurality of integrated circuit chips, each of said integrated circuit chips having first electrically conductive layer-wiring, a first terminal pad formed therein, and a passivation film formed on said first electrically conductive layer-wiring;
a binder material filling gaps between said plurality of integrated circuit chips, said binder material formed of a material selected from a group consisting of monocrystalline silicon, grown polycrystalline silicon and grown amorphous silicon, and binding said integrated circuit chips to said substrate as well as to each other;
a first electrically insulating layer formed on said wired surfaces of said integrated circuit chips and said filled gaps, excluding a portion where said first terminal pad is located;
a second electrically conductive layer-wiring formed on said first electrically insulating layer for operatively connecting said first terminal pads to each other; and
a second terminal pad made of said second electrically conductive layer-wiring formed on said first electrically insulating layer and operatively connected to an external circuit.

10. A wafer-scale integrated device according to claim 9, wherein said binder material comprises essentially the same material as said integrated chips.

11. A wafer-scale integrated device according to claim 10, wherein said binder material comprises grown polycrystalline silicon.

12. A wafer-scale integrated device according to claim 10, wherein said binder material comprises grown amorphous silicon.

13. A wafer-scale integrated device according to claim 9, comprising:
at least one additional second electrically conductive layer-wiring formed on said first electrically insulating layer for operatively interconnecting one of said first terminal pads to another corresponding one of said first terminal pads and for connecting said second terminal pad to the external circuit; and
at least one additional second electrically insulating layer formed on said first electrically insulating layer and said second electrically conductive layer-wiring, excluding a portion where said second terminal pad is located.

14. A wafer-scale integrated device according to claim 9, wherein said wafer-scale integrated device is installed on a surface of a base plate, a bottom surface of said wafer-scale integrated device being fully in contact with the surface of said base plate, whereby said wafer-scale integrated device is mechanically held and heat dissipated in said substrate is removed by conduction through said base plate.

* * * * *